(12) United States Patent
Kato

(10) Patent No.: US 8,236,692 B2
(45) Date of Patent: Aug. 7, 2012

(54) METHOD OF MANUFACTURING SEMICONDUCTOR DEVICE, CLEANING METHOD AND CLEANING CONTROL APPARATUS

(75) Inventor: Tomohide Kato, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 12 days.

(21) Appl. No.: 12/644,370

(22) Filed: Dec. 22, 2009

(65) Prior Publication Data
US 2010/0167541 A1    Jul. 1, 2010

(30) Foreign Application Priority Data

Dec. 25, 2008   (JP) ................................ 2008-329416
Nov. 25, 2009   (JP) ................................ 2009-267530

(51) Int. Cl.
*H01L 21/44* (2006.01)

(52) U.S. Cl. ................. 438/680; 257/E21.002; 438/778

(58) Field of Classification Search .................. 438/778, 438/680, 694; 257/E21.002
See application file for complete search history.

(56) References Cited

U.S. PATENT DOCUMENTS

2010/0175713 A1*   7/2010   Fukiage et al. ................. 134/1.1

FOREIGN PATENT DOCUMENTS

| JP | 2000-68214 | 3/2000 |
|---|---|---|
| JP | 2005-286005 | 10/2005 |
| WO | 2007/116768 A1 | 10/2007 |

OTHER PUBLICATIONS

Certified english's translation of JP 2005-286005].*

* cited by examiner

*Primary Examiner* — Tony Tran
(74) *Attorney, Agent, or Firm* — Brundidge & Stanger, P.C.

(57) ABSTRACT

Efficient cleaning is possible although the film qualities and thicknesses of a reaction tube and a gas supply nozzle are different. There is provided a method of manufacturing a semiconductor device. The method includes forming a film on a substrate, performing a first cleaning process to remove a first deposition substance attached to an inner wall of a gas introducing part, and performing a second cleaning process to remove a second deposition substance attached to an inside of a process chamber and having a chemical composition different from that of the first deposition substance. In the first cleaning process, cleaning conditions are set according to the accumulated supply time of a first source gas supplied to the inside of the process chamber through the gas introducing part, and in the second cleaning process, cleaning conditions are set according to the accumulated thickness of a film formed on the substrate.

5 Claims, 8 Drawing Sheets

METHOD OF MANUFACTURING SEMICONDUCTOR DEVICE, CLEANING METHOD AND CLEANING CONTROL APPARATUS

CROSS-REFERENCE TO RELATED PATENT APPLICATION

This U.S. non-provisional patent application claims priority under 35 U.S.C. §119 of Japanese Patent Application Nos. 2008-329416, filed on Dec. 25, 2008, and 2009-267530, filed on Nov. 25, 2009, in the Japanese Patent Office, the entire contents of which are hereby incorporated by reference.

BACKGROUND OF THE INVENTION

1. Field of the Invention

The present invention relates to a method of manufacturing a semiconductor device, a cleaning method, and a cleaning control apparatus. More particularly, the present invention relates to a method of manufacturing a semiconductor device by supplying a process (source) gas to the surface of a substrate to form a desired film on the substrate, and a cleaning method and a cleaning control apparatus.

2. Description of the Prior Art

In a conventional substrate processing apparatus, when a process gas is supplied, the process gas is distributed not only to the surface of a substrate but also to other parts (for example, the inside of a process chamber), and thus unnecessary films may be accumulated and deposited as attached substances. Such attached substances may include impurities harmful for a substrate processing process, and thus, substrates may be contaminated due to the attached substances.

Therefore, so as to prevent or suppress such a problem, in addition to the supply of a process gas to the process chamber, a cleaning gas is also supplied to the inside of the process chamber (particularly, parts where it is expected that substances are attached) so as to remove substances attached to the inside of the process chamber by converting the substances into harmless gas and then discharging the harmless gas. That is, self-cleaning is performed (for example, refer to Patent Document 1).

Patent Document 1

Japanese Patent No. 3985899

However, since at least a reaction tube configured to place a substrate therein and a process gas supply nozzle configured to supply a process gas to the reaction tube are disposed in the process chamber, different films may be deposited on the inside (inner wall or other parts) of the reaction tube and the inner wall of the process gas supply nozzle according to a method used to supply a process gas to the inside of the process chamber.

Exhaust resistance is caused according to the length of the gas supply nozzle or the shape of a gas supply hole, and if the exhaust resistance is high, the inside pressure of the gas supply nozzle becomes higher than the inside pressure of the reaction tube. In this case, generally, since the reaction rate of a process gas increases as pressure increases, the thickness of a film deposited on the inner wall of the gas supply nozzle becomes greater than the thickness of a film deposited on the inside of the reaction tube. Moreover, according to the kind of chemical reaction, the properties of films such as a crystalline structure may be changed.

By using a silicon source and a nitriding source as process gases, a silicon nitride film can be formed on the surface of a substrate.

In this case, to prevent generation of a reaction byproduct, the process gases are supplied to a process chamber via separate gas supply nozzles. At this time, a silicon film may be formed, due to decomposition of the silicon source, on the inner wall of a first nozzle through which the silicon source is supplied, although formation of a film caused by decomposition of the nitriding source is not observed at the inner wall of a second nozzle through which the nitriding source is supplied. In addition, a silicon nitride film is formed on the inside of a reaction tube as an attached substance. That is, different films may be formed on the inside of the reaction tube and the inner wall of the gas supply nozzle.

In the case where films having different qualities and thicknesses are formed on the inside of the reaction tube and the inner wall of the gas supply nozzle, if a cleaning process is performed under normal conditions, there may arise disadvantages such as an increase of cleaning time, generation of contaminants, and damages on the reaction tube and the gas supply nozzle. Moreover, if a cleaning process is performed under normal conditions, the inner wall of the gas supply nozzle may be etched more rapidly than the inside of the reaction tube.

SUMMARY OF THE INVENTION

An object of the present invention is to provide a method of manufacturing a semiconductor device, a cleaning method, and a cleaning control apparatus that are designed to perform a cleaning process efficiently on the inside of a process chamber while reducing generation of contaminants and damages on a reaction tube and a gas supply nozzle.

According to an aspect of the present invention, there is provided a method of manufacturing a semiconductor device, comprising: loading a substrate into a process chamber; forming a film comprising a plurality of elements on the substrate by supplying a first source gas and second source gas into the process chamber through a first gas introducing part and a second gas introducing part, respectively, the first source gas comprising at least one of the plurality of elements and the second source gas comprising at least one of the plurality of elements other than those of the first source gas; unloading the substrate from the process chamber after the film is formed on the substrate; performing a first cleaning process so as to remove a first deposition substance attached to an inner wall of the first gas introducing part by supplying a cleaning gas to the first gas introducing part, the first deposition substance comprising the at least one of the plurality of elements of the first source gas as a main component, wherein a cleaning condition is set according to an accumulated supply time of the first source gas supplied into the process chamber through the first gas introducing part; and performing a second cleaning process so as to remove a second deposition substance attached to an inside of the process chamber and having a different chemical composition from that of the first deposition substance by supplying the cleaning gas into the process chamber through a third gas introducing part connected to a lower side of the process chamber at a position where the substrate is not placed, the second deposition substance comprising the plurality of elements as main components, wherein the cleaning condition is set according to an accumulated thickness of the film formed on the substrate.

According to another aspect of the present invention, there is provided a cleaning method for removing a film attached to an inside of a process chamber of a substrate processing apparatus which is used to form a film on a substrate by supplying a process gas to the substrate, the cleaning method comprising: setting pressure of the inside of the process chamber to a first pressure and intermittently supplying a cleaning gas to the inside of the process chamber; and setting the pressure of the inside of the process chamber to a second pressure higher than the first pressure and continuously supplying the cleaning gas to the inside of the process chamber.

According to another aspect of the present invention, there is provided a cleaning control apparatus for a process chamber or a silicon-containing gas supply system of a silicon nitride film forming apparatus which is used to form a silicon nitride film having a predetermined silicon/nitrogen composition ratio on a substrate by alternately supplying a silicon-containing gas having a predetermined molecular weight and a nitriding source gas having a predetermined molecular weight, the cleaning control apparatus comprising: a cleaning request signal output unit comprising a memory unit configured to store an accumulated supply amount of silicon-containing gas molecules supplied to an inside of the process chamber through the silicon-containing gas supply system, the cleaning request signal output unit being configured to output a cleaning request signal so as to request cleaning of the silicon-containing gas supply system if the accumulated supply amount of the silicon-containing gas molecules stored in the memory unit becomes equal to or greater than a preset accumulated supply amount of silicon-containing gas molecules; and a cleaning request signal output unit comprising a memory unit configured to store an accumulated supply amount of nitriding source gas molecules supplied to the inside of the process chamber through a nitriding source gas supply system, the cleaning request signal output unit being configured to output a cleaning request signal so as to request cleaning of the nitriding source gas supply system if the accumulated supply amount of the nitriding source gas molecules stored in the memory unit becomes equal to or greater than a preset accumulated supply amount of nitriding source gas molecules.

DETAILED DESCRIPTION OF THE PREFERRED EMBODIMENTS

Embodiments of the present invention will be described hereinafter with reference to the attached drawings.

(1) Structure of Substrate Processing Apparatus

Figure 1:
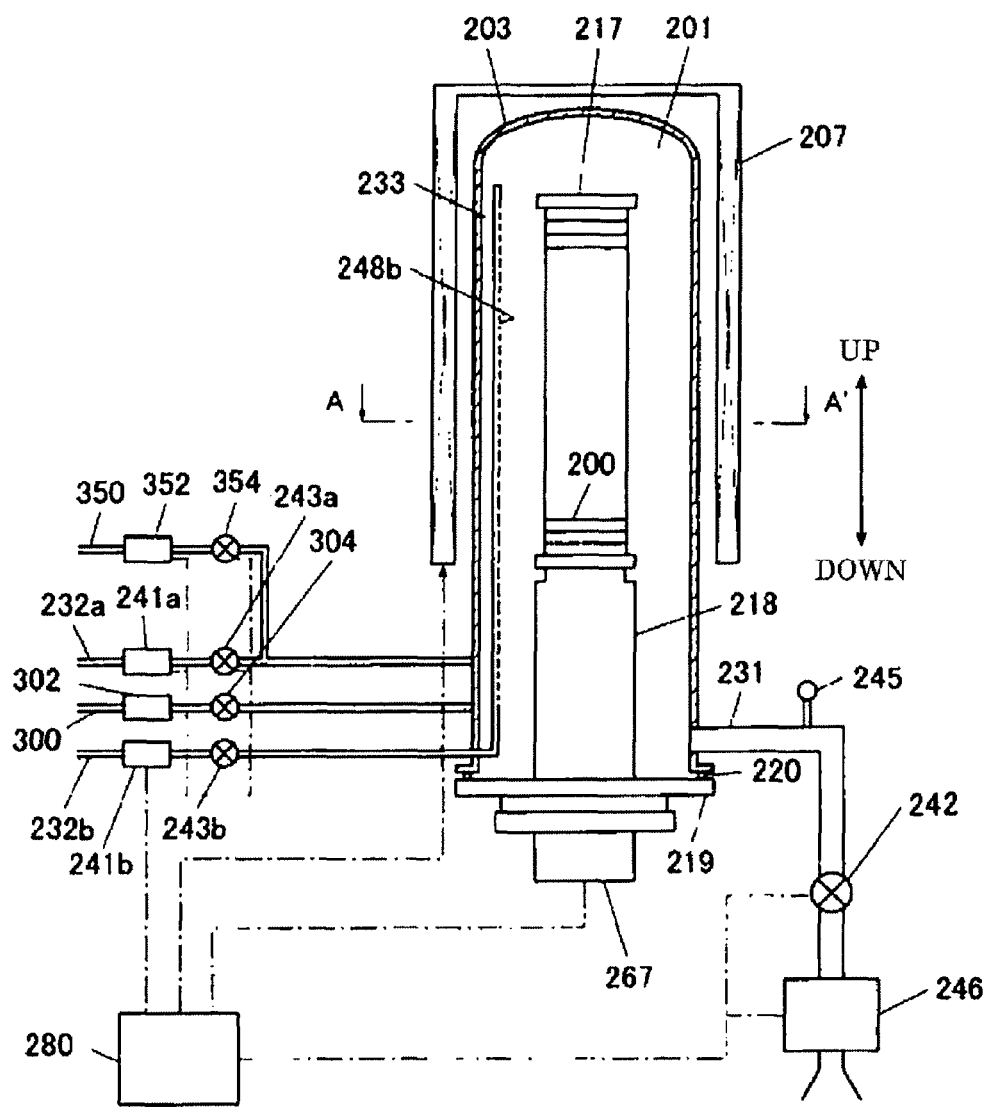
FIG. 1 is a schematic view illustrating a vertical process furnace of a substrate processing apparatus suitable for an embodiment of the present invention.
Figure 2:
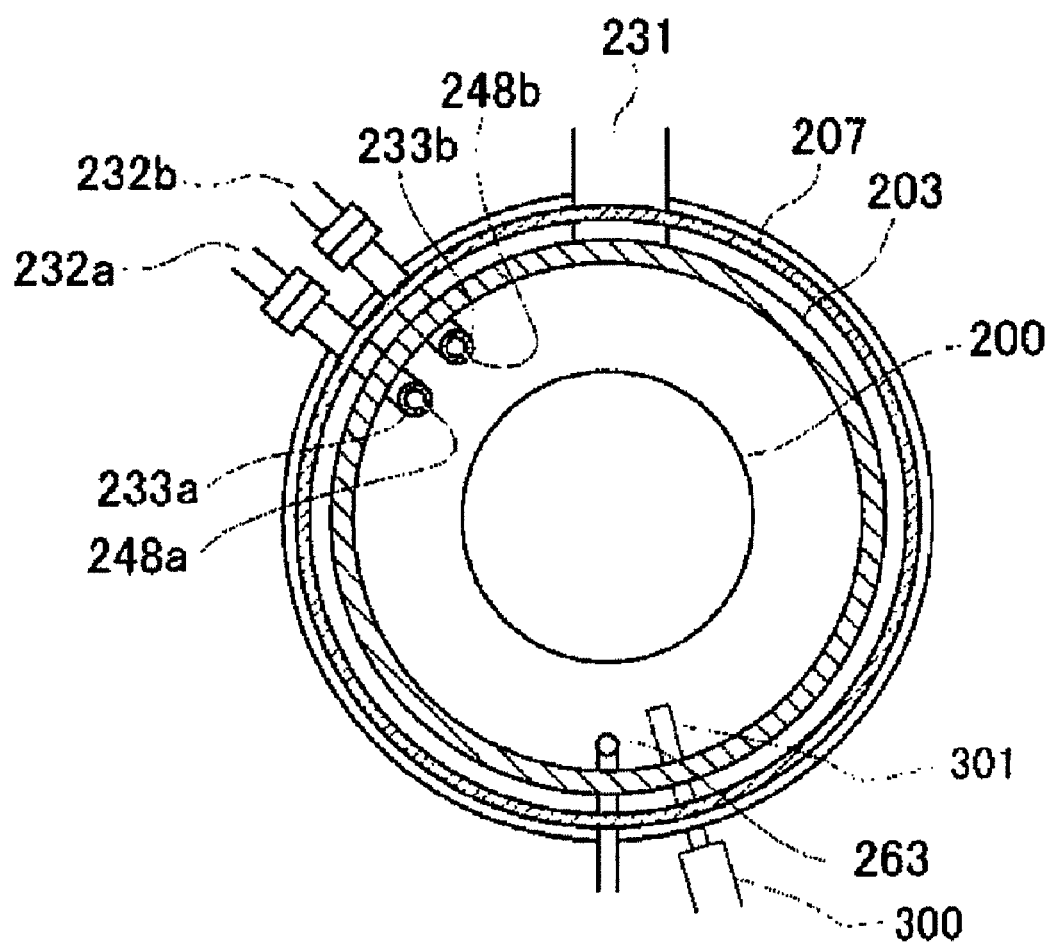
FIG. 2 is a sectional view taken from line A-A' of FIG. 1.

FIG. 1 is a schematic vertical sectional view illustrating a vertical process furnace 202 of a substrate processing apparatus suitable for an embodiment of the present invention. FIG. 2 is a sectional view taken from line A-A' of FIG. 1.

As shown in FIG. 1, the process furnace 202 includes a heater 207 used as a heating unit (heating mechanism). The heater 207 has a cylindrical shape and is vertically installed in a state where the heater 207 is supported on a heater base (not shown) which is a holding plate.

Inside the heater 207, a process tube 203 is installed concentrically with the heater 207 as a reaction tube. The process tube 203 is made of a heat-resistant material such as a quartz ($SiO_2$) or silicon carbide (SiC) and has a cylindrical shape with a closed top side and an opened bottom side. The hollow part of the process tube 203 forms a process chamber 201 and is configured to accommodate substrates such as wafers 200 by using a substrate holder such as a boat 217 (described later) in a manner such that the wafers 200 are horizontally positioned and vertically arranged in multiple stages.

At the lower side of the process chamber 201, a first nozzle 233a and a second nozzle 233b are installed as a first gas introducing part and a second gas introducing part, and a first gas supply pipe 232a and a second gas supply pipe 232b are connected to the first nozzle 233a and the second nozzle 233b, respectively. In this way, as gas supply passages for supplying a plurality of kinds of gases (in the current embodiment, two kinds of gases) to the inside of the process chamber 201, two gas supply pipes are installed. In the structure, the lower side of the process chamber 201 is a region where no wafer 200 is placed, and the lower side of the process chamber 201 is not a heating region.

At the first gas supply pipe 232a, a flowrate controller (flowrate control unit) such as a first mass flow controller (MFC) 241a, and an on-off valve such as a first valve 243a are sequentially installed from the upstream side of the first gas supply pipe 232a. In addition, the first nozzle 233a is connected to the leading end of the first gas supply pipe 232a. In an arc-shaped space between the inner wall of the process tube 203 constituting the process chamber 201 and wafers 200, the first nozzle 233a is installed in a manner such that the first nozzle 233a extends from the lower side to the upper side along the inner wall of the process tube 203 in a direction in which the wafers 200 are stacked. First gas supply holes 248a are formed through the lateral surface of the first nozzle 233a. Along the lower side to the upper side, the first gas supply holes 248a are formed in a manner that the first gas supply holes 248a have the same size and are arranged at the same pitch. A first gas supply system is mainly constituted by the first gas supply pipe 232a, the first MFC 241a, the first valve 243a, and the first nozzle 233a.

At the second gas supply pipe 232b, a flowrate controller (flowrate control unit) such as a second MFC 241b, and an on-off valve such as a second valve 243b are sequentially installed from the upstream side of the second gas supply pipe 232b. In addition, the second nozzle 233b is connected to the leading end of the second gas supply pipe 232b. In an arc-shaped space between the inner wall of the process tube 203 constituting the process chamber 201 and the wafers 200, the second nozzle 233b is installed in a manner such that the second nozzle 233b extends from the lower side to the upper side along the inner wall of the process tube 203 in a direction in which the wafers 200 are stacked. Second gas supply holes 248b are formed through the lateral surface of the second nozzle 233b. Along the lower side to the upper side, the second gas supply holes 248b are formed in a manner that the second gas supply holes 248b have the same size and are arranged at the same pitch. A second gas supply system is mainly constituted by the second gas supply pipe 232b, the second MFC 241b, the second valve 243b, and the second nozzle 233b.

For example, dichlorosilane ($SiH_2Cl_2$, abbreviation: DCS) gas may be supplied from the first gas supply pipe 232a to the inside of the process chamber 201 through the first MFC 241a, the first valve 243a, and the first nozzle 233a. At this time, inert gas may be simultaneously supplied to the inside of the first gas supply pipe 232a. In addition, ammonia ($NH_3$) gas may be supplied from the second gas supply pipe 232b to the inside of the process chamber 201 through the second MFC 241b, the second valve 243b, and the second nozzle 233b. At this time, inert gas may be simultaneously supplied to the inside of the second nozzle 233b.

In addition, at the lower side of the process chamber 201, a short pipe 301 is installed as a third gas introducing part. A first cleaning gas supply pipe 300 which is a cleaning gas supply passage is connected to the short pipe 301. Cleaning gas is used for removing substances attached to the inside of the process chamber 201. At the first cleaning gas supply pipe 300, a flowrate controller (flowrate control unit) such as a third MFC 302, and an on-off valve such as a third valve 304 are installed. Cleaning gas is introduced into the first cleaning gas supply pipe 300 for supplying the cleaning gas to the process chamber 201.

A second cleaning gas supply pipe 350, which is a cleaning gas supply passage separate from the first cleaning gas supply pipe 300, is connected to the first gas supply pipe 232a. At the second cleaning gas supply pipe 350, a flowrate controller (flowrate control unit) such as a fourth MFC 352, and an on-off valve such as a fourth valve 354 are installed. Cleaning gas is introduced into the second cleaning gas supply pipe 350 for supplying the cleaning gas to the process chamber 201 through the first gas supply pipe 232a.

In addition, a gas exhaust pipe 231 is installed to exhaust the inside atmosphere of the process chamber 201. A vacuum exhaust device such a vacuum pump 246 is connected to the downstream side of the gas exhaust pipe 231 opposite to the process tube 203 through a pressure detector such as a pressure sensor 245 and a pressure regulator such as an auto pressure controller (APC) valve 242. The APC valve 242 is an on-off valve, which can be opened and closed to start and stop vacuum evacuation of the inside of the process chamber 201 and can be adjusted in opened degree for pressure adjustment. While operating the pressure sensor 245, by controlling the opened degree of the APC valve 242 based on pressure information detected by the pressure sensor 245, the inside of the process chamber 201 can be vacuum-evacuated to a desired pressure (vacuum degree).

A seal cap 219 is installed as a furnace port cover capable of hermetically closing the opened bottom side of the process tube 203. For example, the seal cap 219 is made of a metal such as stainless steel and has a disk shape. On the top surface of the seal cap 219, an O-ring 220 is installed as a seal member. At a side of the seal cap 219 opposite to the process chamber 201, a rotary mechanism 267 is installed to rotate a boat 217 (described later) which is a substrate holder. A rotation shaft (not shown) of the rotary mechanism 267 is connected to the boat 217 through the seal cap 219. The rotary mechanism 267 is configured to rotate wafers 200 by rotating the boat 217. The seal cap 219 is configured to be vertically moved by an elevating mechanism such as a boat elevator (not shown) which is vertically installed outside the process tube 203. The boat elevator is configured to move the seal cap 219 vertically for loading/unloading the boat 217 to/from the process chamber 201.

The boat 217 is made of a heat-resistant material such as quartz or silicon carbide and is configured to support a plurality of wafers 200 in a state where the wafers 200 are horizontally oriented and arranged in multiple stages with the centers of the wafers 200 being aligned with each other. In addition, at the lower part of the boat 217, an insulating member 218 made of a heat-resistant material such as quartz or silicon carbide is installed so as to prevent heat transfer from the heater 207 to the seal cap 219. The insulating member 218 may include a plurality of insulating plates made of a heat-resistant material such as quartz or silicon carbide, and an insulating plate holder configured to support the insulating plates in a state where the insulating plates are horizontally oriented and arranged in multiple stages. Inside the process tube 203, a temperature sensor 263 is installed as a temperature detector, and by controlling power supplied to the heater 207 based on temperature information detected by the temperature sensor 263, desired temperature distribution can be attained at the inside of the process chamber 201. Like the first nozzle 233a and the second nozzle 233b, the temperature sensor 263 is installed along the inner wall of the process tube 203.

A controller 280 which is a control unit (control device) is connected to the first to fourth MFC 241a, 241b, 302, and 352, the first to fourth valves 243a, 243b, 304, and 305, the pressure sensor 245, the APC valve 242, the heater 207, the temperature sensor 263, the vacuum pump 246, the rotary mechanism 267, and so on.

The controller 280 is used to control, for example, flowrates of the first to fourth MFC 241a, 241b, 302, and 352; opening/closing operations of the first to fourth valves 243a, 243b, 304, and 305; opening/closing operations of the APC valve 242 and pressure adjusting operations of the APC valve 242 based on the pressure sensor 245; the temperature of the heater 207 based on the temperature sensor 263; starting/stopping operations of the vacuum pump 246; and the rotation speed of the rotary mechanism 267.

(2) Method of Forming Silicon Nitride Film

Next, as an example of a film-forming method for a semiconductor device manufacturing process using the above-described substrate processing apparatus, an exemplary method of forming a silicon nitride (SiN) film containing stoichiometrically excessive silicon (Si) with respect to nitrogen (N) (i.e., a silicon-rich silicon nitride film) by using dichlorosilane (DCS) and ammonia ($NH_3$) will now be described according to an embodiment. In addition, the present invention can be applied to any kind of film without being limited to a silicon-rich silicon nitride film so long as the film is formed by using two or more kinds of gases.

In the following description, components of the substrate processing apparatus are controlled by the controller 280.

In the current embodiment, a film is formed by using a method similar to but not identical to an atomic layer deposition (ALD) method. In an ALD method, process gases which provide at least two source materials for forming a film are supplied to a substrate in turns under predetermined film forming conditions (temperature, time, etc.), so as to allow the process gases to be adsorbed on the substrate on an atomic layer basis for forming a film by surface reaction. At this time, the thickness of the film can be controlled by adjusting the number of process gas supply cycles (for example, if the film forming rate is 1 Å/cycle and it is intended to form a 20-Å film, the process is repeated 20 cycles).

That is, in the film-forming method of the current embodiment, a process of supplying DCS to a wafer 200 under conditions where chemical vapor deposition (CVD) reaction is caused, and a process of supplying $NH_3$ to the wafer 200 under a non-plasma condition and other predetermined conditions are repeated in turns so as to form a silicon-rich silicon nitride (SiN) In the current embodiment, a process (Step 1) of supplying DCS to a wafer 200, a process (Step 2) of removing the DCS from the wafer 200, a process (Step 3) of supplying $NH_3$ to the wafer 200, and a process (Step 4) of removing the $NH_3$ from the wafer 200 are set to one cycle, and the cycle is repeated a plurality of times to form a silicon-rich silicon nitride (SiN) film. In the process (Step 1) of supplying DCS to a wafer 200, a silicon film having several or less atomic layers (1/n to several atomic layers) is formed on the wafer 200. At this time, an excessive amount of silicon (Si) is supplied. Furthermore, in the process (Step 3) of supplying $NH_3$ to the wafer 200, the silicon film having several or less atomic layers and formed on the wafer 200 is thermally nitrided. At this time, the silicon film is nitrided by $NH_3$ in a non-saturated condition. That is, the silicon film is not completely nitrided, and thus Si—N bonds are not fully made. In this way, nitriding of silicon (Si) is suppressed, and thus silicon (Si) becomes surplus. At this time, to obtain a condition where nitriding of the silicon film is not saturated, it is preferable that at least one of the supply flowrate of $NH_3$, the supply time of $NH_3$, and the inside pressure of the process chamber 201 be adjusted to be different from a condition where the nitriding of the silicon film is saturated. That is, as compared with a condition where nitriding of the silicon film is saturated, the supply flowrate of $NH_3$ is reduced, the supply time of $NH_3$ is shortened, or the inside pressure of the process chamber 201 is reduced. For example, a small amount of $NH_3$ is supplied as compared with the amount of $NH_3$ necessary for forming a silicon nitride ($Si_3N_4$) film having a stoichiometric composition. As described above, the supply flowrate of silicon (Si) is controlled in the process of forming a silicon film having several or less atomic layers on a wafer 200 by using a CVD method, and the nitriding degree of silicon (Si) is controlled in the process of thermally nitriding the silicon film with $NH_3$. The processes are alternately repeated to form a silicon-rich silicon nitride (SiN) film while controlling the Si/N composition ratio of the silicon nitride (SiN).

Figure 3:
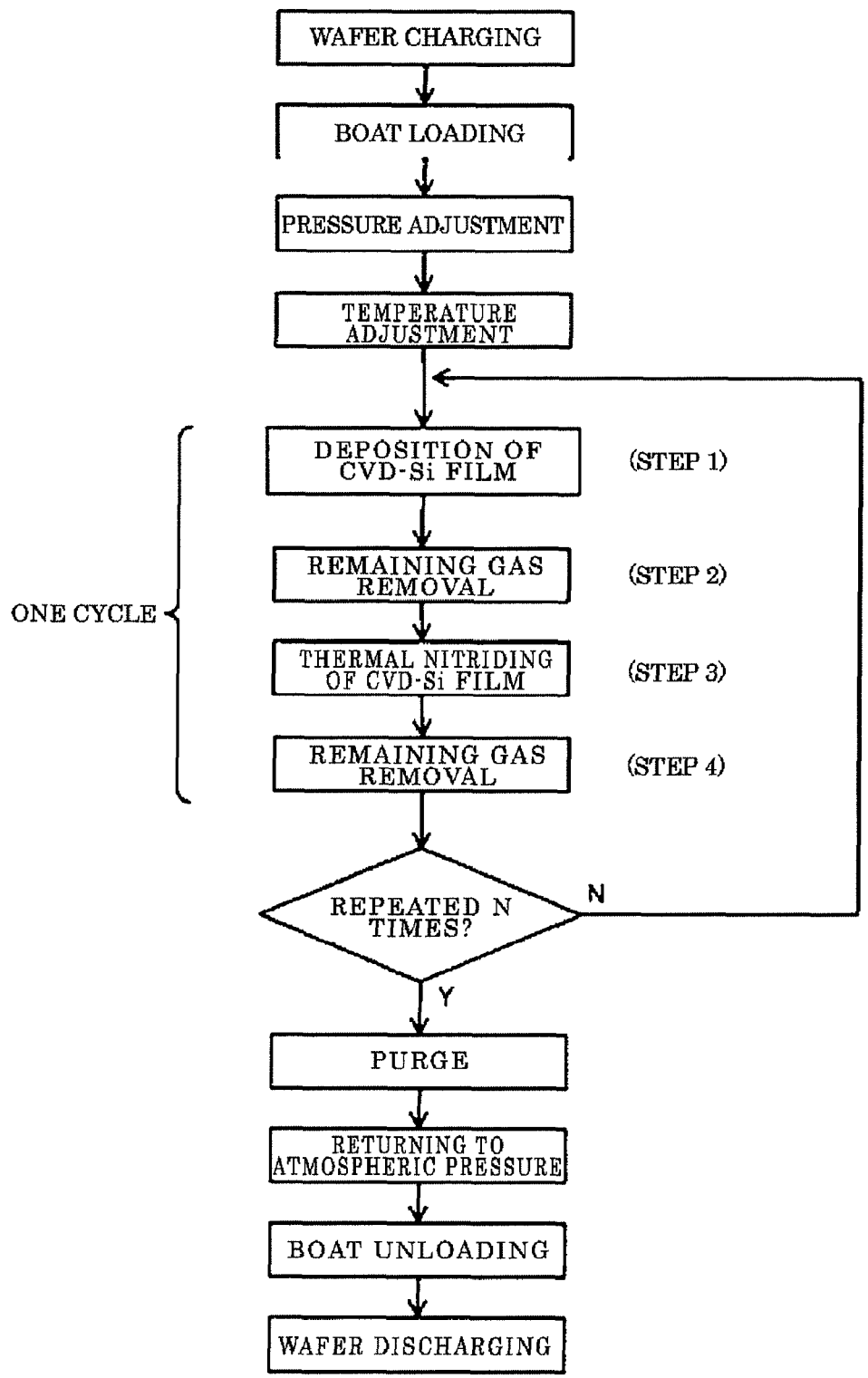
FIG. 3 is a flowchart for explaining a film-forming method according to an embodiment of the present invention.

Hereinafter, the film-forming method of the current embodiment will be described in detail with reference to FIG. 3.

After a plurality of wafers 200 are charged into the boat 217 (wafer charging), as shown in FIG. 1, the boat 217 in which the plurality of wafers 200 are charged is lifted and loaded into the process chamber 201 by the boat elevator (not shown) (boat loading). In this state, the bottom side of the process tube 203 is sealed by the seal cap 219 with the O-ring 220b being disposed therebetween.

The inside of the process chamber 201 is vacuum-evacuated to a desired pressure (vacuum degree) by using the vacuum pump 246. At this time, the pressure inside the process chamber 201 is measured by the pressure sensor 245, and based on the measured pressure, the APC valve 242 is feedback-controlled (pressure adjustment). In addition, the inside of the process chamber 201 is heated to a desired temperature by using the heater 207. At this time, to obtain desired temperature distribution inside the process chamber 201, power to the heater 207 is feedback-controlled based on temperature information measured by the temperature sensor 263 (temperature adjustment). Next, the boat 217 is rotated by the rotary mechanism 267 to rotate the wafers 200. Thereafter, the following four steps are sequentially performed.

(Step 1)

The first valve 243a of the first gas supply pipe 232a is opened to allow DCS to flow through the first gas supply pipe 232a. At this time, inert gas may be allowed to flow through the first gas supply pipe 232a. The flowrate of DCS flowing through the first gas supply pipe 232a is controlled by the first MFC 241a, and the DCS is mixed with flowrate-controlled inert gas. Then, the mixture is supplied to the inside of the process chamber 201 through the first gas supply holes 248a of the first nozzle 233a and is discharged through the gas exhaust pipe 231. At this time, the APC valve 242 is properly controlled to keep the inside of the process chamber 201 at a pressure of 133 Pa to 1333 Pa, for example, 133 Pa. The first MFC 241a is used to adjust the flowrate of DCS in the range from 0.1 slm to 10 slm, for example, 0.5 slm. The wafers 200 are exposed to DCS, for example, for 1 second to 180 seconds. At this time, the heater 207 is controlled to allow thermal decomposition of DCS for inducing CVD reaction. That is, the heater 207 is controlled to heat the wafers 200 to a temperature of 550° C. to 700° C., for example, 630° C. By supplying DCS to the inside of the process chamber 201 under the above-described conditions, silicon (Si) films each including several or less atomic layers (that is, 1/n atomic layer to several atomic layers) are formed on the wafers 200 (deposition of CVD-Si film). For example, silicon films each including a half atomic layer (half layer) or a mono atomic layer (mono layer) may be formed. In this way, silicon (Si) is excessively supplied.

(Step 2)

After the silicon films each including several or less atomic layers are formed, the first valve 243a of the first gas supply pipe 232a is closed so as to interrupt supply of DCS. At this time, in a state where the APC valve 242 of the gas exhaust pipe 231 is opened, the inside of the process chamber 201 is vacuum-exhausted to 10 Pa or less by using the vacuum pump 246 to remove remaining DCS from the inside of the process chamber 201. Along with this, if inert gas such as $N_2$ is supplied to the inside of the process chamber 201, the remaining DCS may be removed more efficiently (remaining gas removal).

(Step 3)

The second valve 243b of the second gas supply pipe 232b is opened to allow $NH_3$ to flow through the second gas supply pipe 232b. At this time, inert gas may be allowed to flow through the second gas supply pipe 232b. The flowrate of $NH_3$ flowing through the second gas supply pipe 232b is controlled by the second MFC 241b, and the $NH_3$ is mixed with flowrate-control led inert gas. Then, the mixture is supplied to the inside of the process chamber 201 through the second gas supply holes 248b of the second nozzle 233b and is discharged through the gas exhaust pipe 231. As described above, $NH_3$ is supplied to the inside of the process chamber 201 in a state where the $NH_3$ is not activated by plasma.

In Step 3, the inside conditions of the process chamber 201 are adjusted so that the silicon films are nitrided under conditions where the nitriding reaction of the silicon film by the $NH_3$ is not saturated. That is, the supply amount of $NH_3$ is adjusted to be less than an amount necessary for nitriding the silicon films to form silicon nitride ($Si_3N_4$) films each having a stoichiometric composition. In addition, at this time, the APC valve 242 is properly adjusted to keep the inside of the process chamber 201 at a pressure of 133 Pa to 1333 Pa, for example, 865 Pa. The second MFC 241b is controlled to supply $NH_3$ at a flowrate of 0.1 slm to 10 slm, for example, 1 slm. The wafers 200 are exposed to $NH_3$ for 1 second to 180 seconds. At this time, the heater 207 is controlled so as to keep the wafers 200 in the same temperature range of 550° C. to 700° C., for example, 630° C., like the case of supplying DCS in Step 1. In this way, $NH_3$ is supplied to the inside of the process chamber 201 in a non-plasma condition, so as to thermally nitride the silicon films each including several or less atomic layers and formed on the wafers 200 (thermal nitriding of CVD-Si film). At this time, since silicon is excessive due to the restrained nitriding of silicon (Si), silicon-rich silicon nitride films can be formed.

If it is assumed that all DCS and $NH_3$ supplied to the inside of the process chamber 201 are used to form a silicon nitride film, a silicon nitride ($Si_3N_4$) film having a stoichiometric composition can be formed on a wafer 200 by supplying DCS which is a silicon-containing substance and $NH_3$ which is a nitrogen-containing substance to the inside of the process chamber 201 at a ratio of 3:4. In the current embodiment, however, the supply amount of $NH_3$ is less than the amount necessary for thermally nitriding a silicon film to form a silicon nitride ($Si_3N_4$) film having a stoichiometric composition. That is, the supply amount of $NH_3$ is restricted so as not to saturate nitriding reaction of the silicon film. In this way, the amount of nitrogen is adjusted to be insufficient for forming a silicon nitride ($Si_3N_4$) film having a stoichiometric composition, so that a silicon-rich silicon nitride film can be formed on the wafer 200.

Practically, the composition ratio of silicon/nitrogen of a silicon nitride film is varied not only by the supply amount of $NH_3$, but also by other conditions in Step 3, such as difference of reactiveness caused by the inside pressure of the process chamber 201, difference of reactiveness caused by the temperature of a wafer 200, the supply flowrate of $NH_3$, and the supply time of $NH_3$ (that is, reaction time). In addition, the composition ratio of silicon and nitrogen of a silicon nitride film is also varied by conditions in Step 1, such as the pressure inside the process chamber 201, the temperature of a wafer 200, the supply flowrate of DCS, and the supply time of DCS. That is, controlling of the balance between the supply of silicon (Si) in Step 1 and the supply of nitrogen (N) in Step 3 is important for controlling the composition ratio of silicon and nitrogen (Si/N ratio) of a silicon nitride film. In the current embodiment, the pressure inside the process chamber 201, the temperature of a wafer 200, the supply flowrate of gas, and the supply time of gas are properly controlled within the above-described mentioned ranges, so as to control the composition ratio of silicon/nitrogen of a silicon nitride film. If the amount of silicon (Si) supplied in Step 1 is concerned as a reference (is fixed to a predetermined value), the Si/N ratio is most dependent on the supply flowrate of $NH_3$, the supply time of $NH_3$, and the pressure inside the process chamber 201 among conditions in Step 3. Therefore, in Step 3, it is preferable that at least one of the supply flowrate of $NH_3$, the supply time of $NH_3$, and the pressure inside the process chamber 201 be different from conditions where the nitriding reaction of a silicon film is saturated. Specifically, the supply flowrate of $NH_3$, the supply time of $NH_3$, or the pressure inside the process chamber 201 may be reduced as compared with a condition where the nitriding reaction of a silicon film is saturated.

(Step 4)

After the silicon films each including several or less atomic layers are thermally nitrided, the second valve 243b of the second gas supply pipe 232b is closed to interrupt supply of $NH_3$. At this time, in a state where the APC valve 242 of the gas exhaust pipe 231 is opened, the inside of the process chamber 201 is exhausted to a pressure of 10 Pa or less to remove remaining $NH_3$ from the inside of the process chamber 201. Along with this, if inert gas such as $N_2$ is supplied to the inside of the process chamber 201, remaining $NH_3$ can be removed more efficiently (remaining gas removal).

By setting the above-mentioned Steps 1 to 4 to one cycle, and repeating this cycle a plurality of times, silicon-rich silicon nitride films can be formed on the wafers 200 to a predetermined thickness.

After silicon-rich silicon nitride films are formed to a predetermined thickness, the inside of the process chamber 201 is purged by supplying inert gas such as $N_2$ to the inside of the process chamber 201 and exhausting the inert gas from the inside of the process chamber 201 (purge). By this, the inside atmosphere of the process chamber 201 is replaced with inert gas, and the inside pressure of the process chamber 201 is returned to atmospheric pressure (returning to atmospheric pressure).

Thereafter, the seal cap 219 is moved downward by the boat elevator (not shown) so as to open the bottom side of the process tube 203 and unload the processed wafers 200 from the inside of the process tube 203 through the bottom side of the process tube 203 in a state where the processed wafers 200 are held in the boat 217 (boat unloading). Then, the processed wafers 200 are discharged from the boat 217 (wafer discharging).

Although DCS is used as a silicon source in the above description, the present invention is not limited thereto. For example, another substance such as trichlorosilane ($SiHCl_3$, abbreviation: TCS), hexachlorosilane ($Si_2Cl_6$, abbreviation: HCD), monosilane ($SiH_4$), and disilane ($Si_2H_6$) may be used.

(3) Cleaning Method

After a process of forming a silicon-rich silicon nitride is performed predetermined times, a cleaning process is performed on the process chamber 201 by using a cleaning gas. In the current embodiment, for example, chlorine trifluoride ($ClF_3$) is used as a cleaning gas.

The first nozzle 233a and the inside of the process tube 203 (for example, the inner wall of the process tube 203, the outer walls of the first nozzle 233a and the second nozzle 233b, and the boat 217) are cleaned under conditions optimal for the respective parts.

<Method of Cleaning Inner Wall of First Nozzle>

Figure 4:
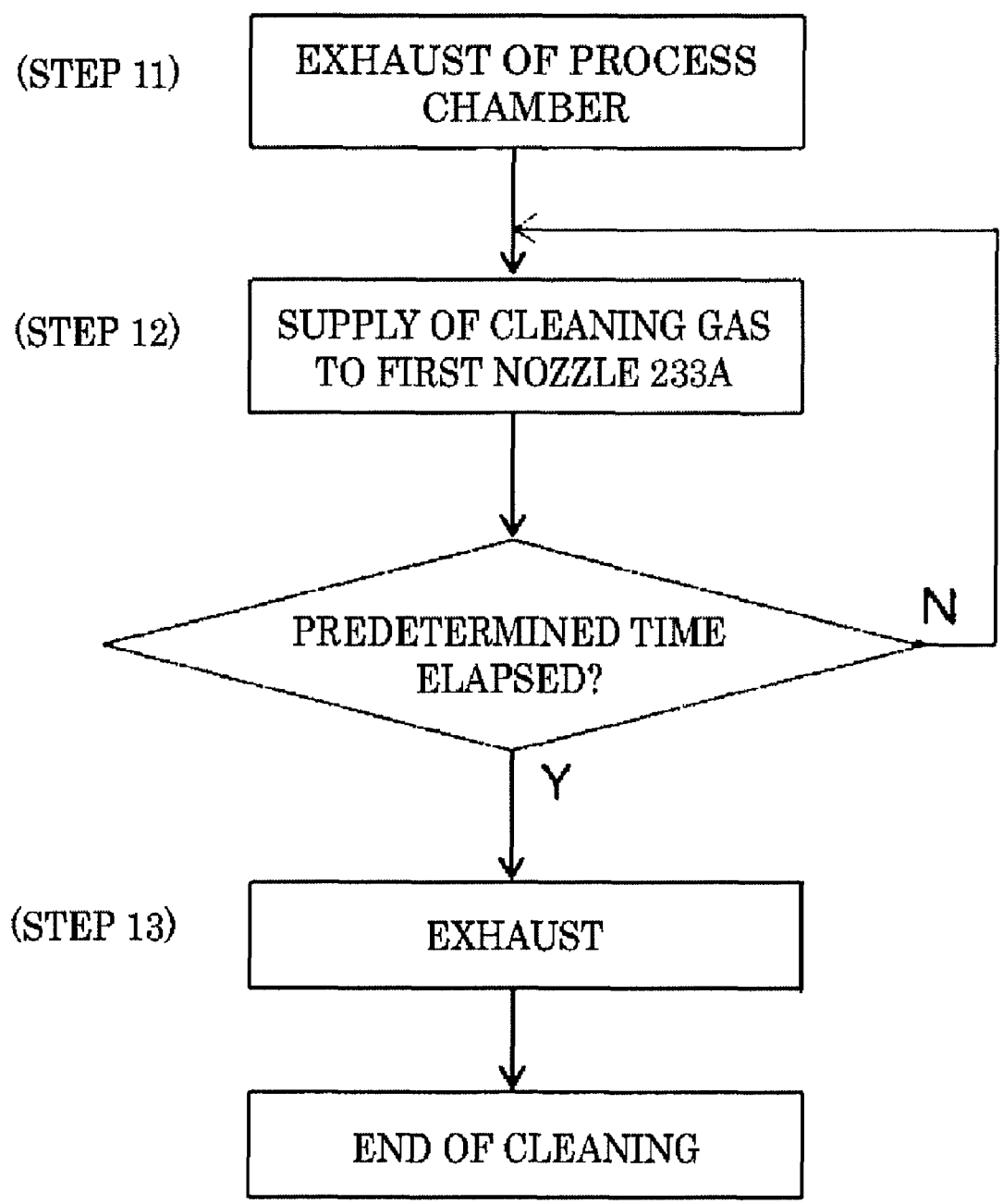
FIG. 4 is a flowchart for explaining a cleaning method according to an embodiment of the present invention.

First, cleaning of the inner wall of the first nozzle 233a will be explained (FIG. 4). Cleaning of the inner wall of the first nozzle 233a is performed under a pressure lower than a pressure at which the inside of the process tube 203 is cleaned.

(Step 11)

In Step 11, first, the APC valve 242 is opened to exhaust the inside of the process chamber 201. At this time, the fourth valve 354 and the first valve 243a are closed.

(Step 12)

If the inside of the process chamber 201 is sufficiently exhausted, the fourth valve 354 is opened to supply $ClF_3$ gas to the first nozzle 233a while controlling the flowrate of the $ClF_3$ gas by using the fourth MFC 352 (Step 12). At this time, the flowrate of the $ClF_3$ gas is set to from 0.1 slm to 0.4 slm, for example, 0.1 slm. In addition, inert gas such as $N_2$ gas is simultaneously supplied, for example, at a flowrate of 0.4 slm, and the $ClF_3$ concentration of the inside of the first nozzle 233a is set to from 20% to 50%, for example, 20%. In the case where the $ClF_3$ concentration of the inside of the first nozzle 233a is kept higher than 20%, the flowrate of $N_2$ gas simultaneously supplied through a part such as the second nozzle 233b is increased so as to keep the concentration of $ClF_3$ equal to or lower than 20% when the $ClF_3$ is exhausted from the inside of the process chamber 201.

Furthermore, in a state where the APC valve 242 is opened, the controller 280 adjusts pressure to a predetermined level. Preferably, the pressure is adjusted to a constant level between 10 Pa to 400 Pa, for example, 66.7 Pa (0.5 Torr). By this, a silicon film (unnecessary silicon film to be removed), which is accumulated on the inner wall of the first nozzle 233a during the above-described film-forming process, is brought into reaction with supplied $ClF_3$ gas.

(Step 13)

After $ClF_3$ gas is supplied to the first nozzle 233a for a predetermined time, the first valve 243a is closed, and the inside of the process chamber 201 is exhausted (Step 13). In addition, while $ClF_3$ is supplied through the first nozzle 233a, inert gas such as $N_2$ gas may be supplied to the inside of the process chamber 201 through the second nozzle 233b and the short pipe 301. By supplying inert gas such as $N_2$ gas, reverse flows of $ClF_3$ gas from the inside of the process chamber 201 to the second nozzle 233b and the short pipe 301 can be prevented.

<Method of Cleaning Inside of Process Tube>

Next, a method of cleaning the inside of the process tube 203 will be explained.

Figure 5:
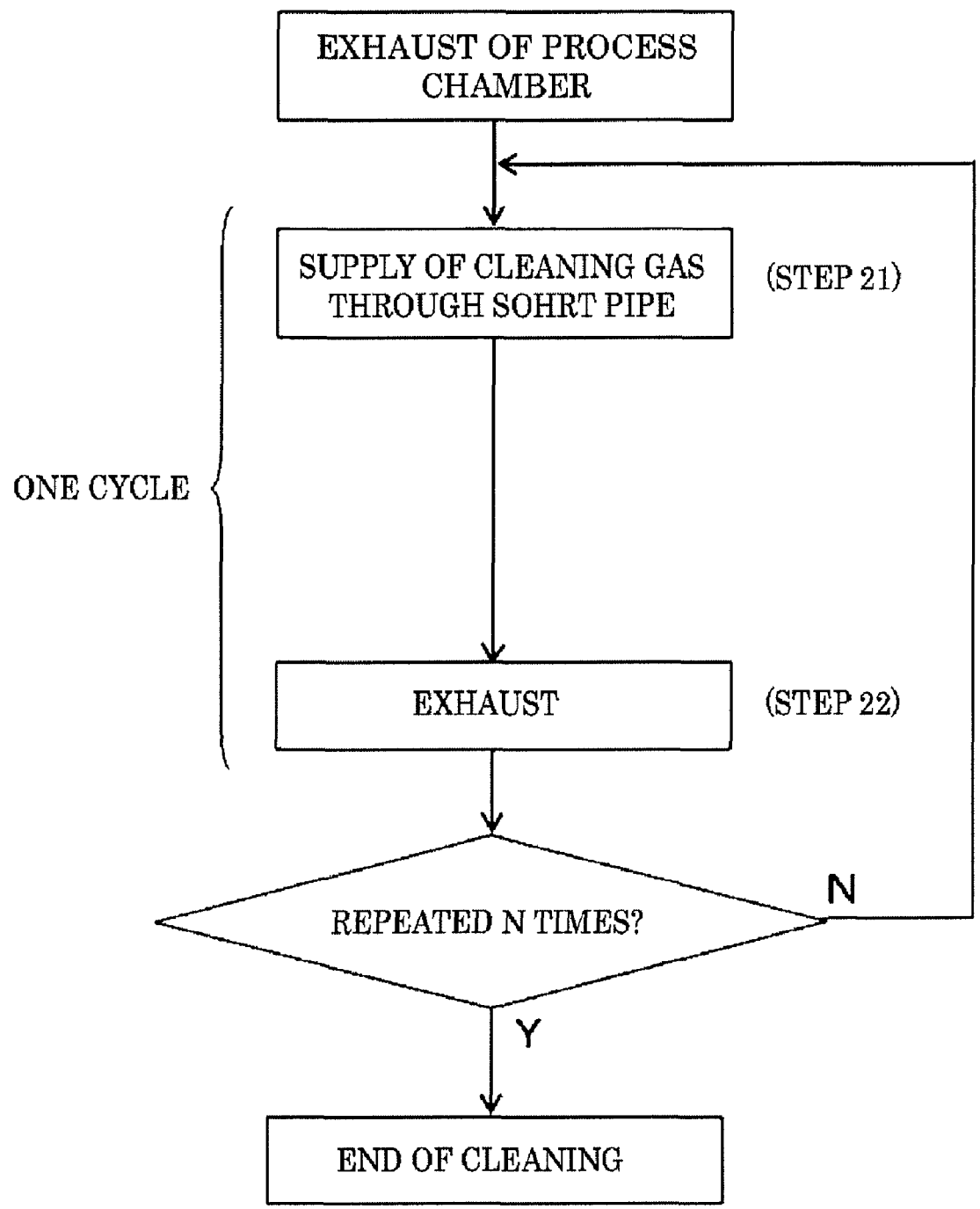
FIG. 5 is a flowchart for explaining a cleaning method according to an embodiment of the present invention.

The following two steps are mainly performed (FIG. 5).

(Step 21)

In Step 21, the process chamber 201 is filled with $ClF_3$ gas. First, the temperature of the heater 207 is set to from 400° C. to 420° C., for example, 400° C. Then, in a state where the inside of the process chamber 201 is exhausted by opening the APC valve 242 (the fourth valve 354 is closed), the third valve 304 is opened to supply $ClF_3$ to the first cleaning gas supply pipe 300 and fully fill the inside of the process chamber 201 with the $ClF_3$. For example, the flowrate of $ClF_3$ supplied through the short pipe 301 is set to 0.5 slm. Since parts such as an exhaust pipe may be corroded if the concentration of $ClF_3$ is high, the concentration of $ClF_3$ is set to, for example, 20%. To control the inside pressure of the process chamber 201, the APC valve 242 is opened, and the inside pressure of the process chamber 201 is adjusted to a predetermined level. Preferably, the inside pressure of the process chamber 201 is adjusted to a constant level between 400 Pa to 1000 Pa, for example, 931 Pa (7 Torr).

By supplying $ClF_3$ to the inside of the process chamber 201 through the short pipe 301 as described above, the inside of the process chamber 201 can be cleaned without involving the first nozzle 233a.

In addition, inert gas such as $N_2$ gas may be supplied through the first nozzle 233a and the second nozzle 233b. By supplying $N_2$ gas, reverse flows of $ClF_3$ gas from the inside of the process chamber 201 to the first nozzle 233a and the second nozzle 233b can be prevented. The flowrate of $N_2$ gas supplied through the first nozzle 233a and the second nozzle 233b may be 0.8 slm, for example. Furthermore, inert gas such as $N_2$ gas may be supplied through the rotation shaft (not shown) of the rotary mechanism 267, for example, at a flowrate of 0.3 slm.

Then, if a predetermined time (for example, 85 seconds) elapses after the third valve 304 is opened, Step 22 is performed.

(Step 22)

In Step 22, gas filled in the process chamber 201 is exhausted. A silicon nitride film (unnecessary silicon nitride film to be removed) accumulated in the process chamber 201 during the film-forming process is brought into reaction with $ClF_3$ supplied in Step 21, and $ClF_3$ gas (including $ClF_3$ gas not participated in reaction) and $N_2$ gas are mainly filled in the process chamber 201. Therefore, such gases are exhausted from the process chamber 201.

In detail, the APC valve 242 is opened so as to exhaust gas filled in the process chamber 201 at a time through the gas exhaust pipe 231.

Then, if a predetermined time (for example, 10 seconds) after the APC valve 242 is opened, Step 22 is stopped. Thereafter, Step 21 and Step 22 are set as a cycle, and the cycle is repeated predetermined times. In this way, cleaning of the inside of the process tube 203 is completed.

Furthermore, in Step 22, at the same time with vacuum evacuation, $N_2$ purge may be performed by supplying inert gas such as $N_2$ through the first nozzle 233a, the second nozzle 233b, and the short pipe 301; or in Step 22, vacuum evacuation and $N_2$ purge may be alternately repeated predetermined times.

By repeating Step 21 and Step 22 (one cycle) predetermined times, the inside of the process tube 203 is cleaned. As described above, exhaustion of gas that does not contribute to cleaning, and supply of new $ClF_3$ gas are repeated, so that cleaning gas can be effectively reacted with a silicon nitride accumulated in the inside of the process tube 203.

Either the cleaning of the inner wall of the first nozzle 233a or the cleaning of the inside of the process tube 203 may first be performed, and then the other may be performed; however, it is preferable that the cleaning of the inner wall of the first nozzle 233a be first performed. In the case where the cleaning of the inner wall of the first nozzle 233a is first performed, $ClF_3$ gas that passes through the first nozzle 233a with reaction is supplied to the inside of the process tube 203, and the $ClF_3$ gas reacts with a silicon nitride film accumulated in the inside (inner wall, etc.) of the process tube 203, so that the silicon nitride film can be removed. Therefore, if the cleaning of the inside of the process tube 203 is performed after the cleaning of the inner wall of the first nozzle 233a, time necessary for cleaning the inside of the process tube 203 can be reduced. That is, by cleaning the inner wall of the first nozzle 233a first, a high etching rate can be obtained, and thus throughput can be improved.

In addition, since a silicon nitride film is attached to almost all the region of the inside of the process tube 203, the cleaning cycle may be determined according to the thickness of the silicon nitride film accumulated in the process tube 203 (corresponding to the amount of deposition on a wafer), and the cleaning cycle may be performed each time after the film-forming process is repeated a predetermined number of times. Therefore, cleaning conditions of the inside of the process tube 203 such as the inside pressure of the process tube 203 or the supply flowrate of cleaning gas may be determined according to the actual amount of deposition. The amount of deposition on wafers can be calculated by monitoring the supply flowrate of $NH_3$.

Meanwhile, the thickness of a silicon film accumulated on the inner wall of the first nozzle 233a is varied according to film-forming conditions such as substrate temperature, DCS supply time, and DCS supply amount. Therefore, cleaning conditions of the inner wall of the first nozzle 233a such as the inside pressure of the first nozzle 233a and the supply flowrate of cleaning gas are determined according to film-forming conditions such as DCS supply time and DCS supply flowrate. The cleaning cycle of the inside of the first nozzle 233a is determined according to film-forming conditions such as DCS supply time and DCS supply flowrate. In addition, when DCS is supplied as a process gas, the thickness of a silicon film accumulated on the inner wall of the first nozzle 233a may be proportional to the supply amount of silicon molecules.

As described above, for removing the thickness of a film by a desired amount, that is, for removing the accumulated thickness of a film by a desired amount, cleaning conditions of the inside of the process tube 203 are adjusted according to the number of cycles of the silicon nitride film forming process, and cleaning conditions of the inner wall of the first nozzle 233a are adjusted according to film-forming conditions such as DCS supply time and DCS supply flowrate.

Figure 7A:
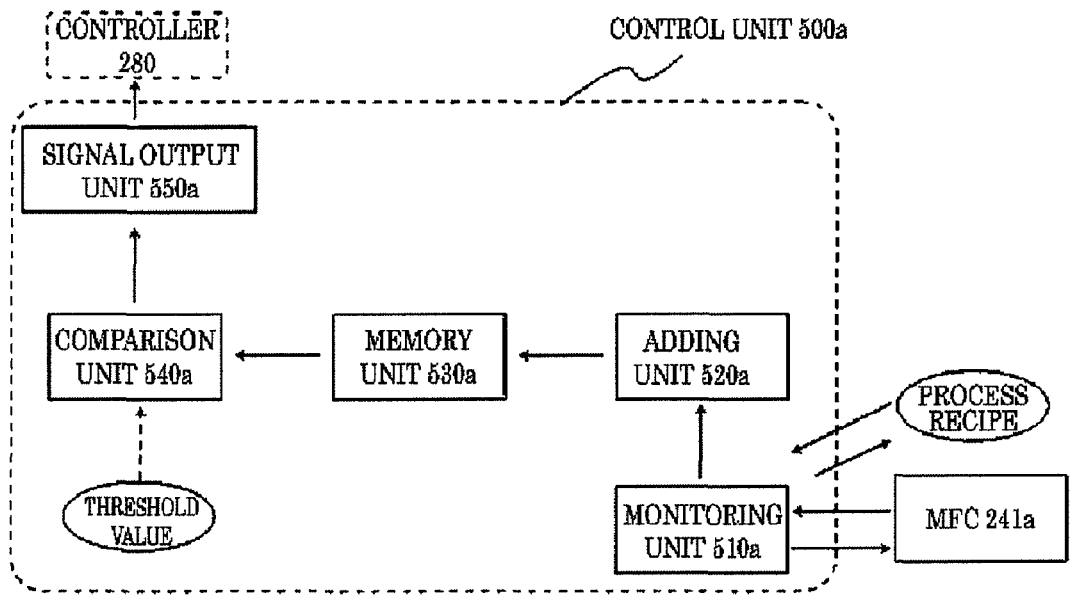
FIG. 7A and FIG. 7B are views illustrating control units according to an embodiment of the present invention.
Figure 7B:
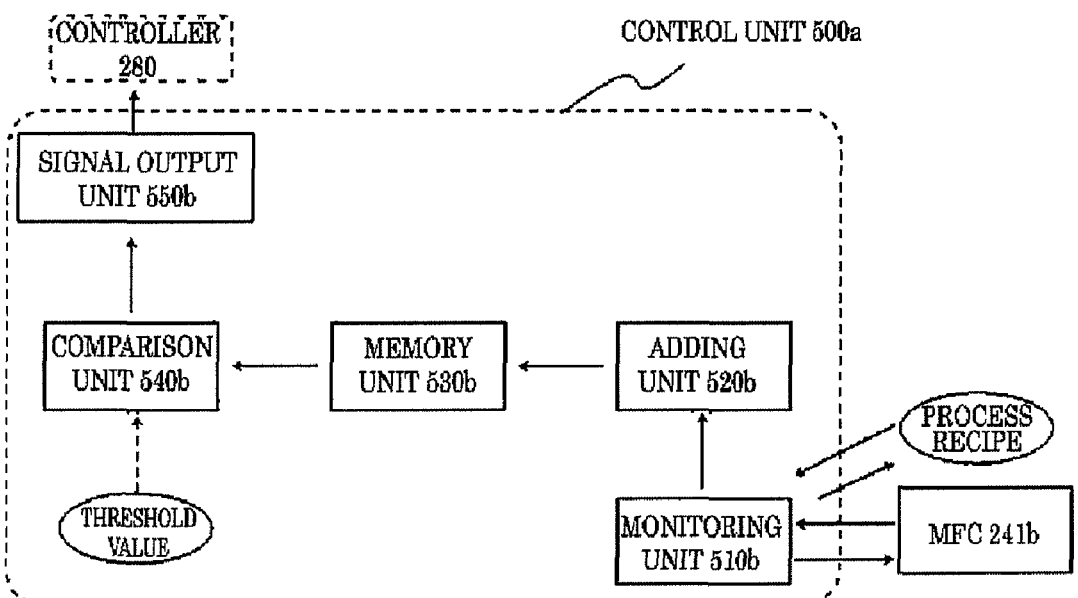

In addition, preferably, the cleaning conditions and cleaning timing of the insides of the first nozzle 233a and the process tube 203 may be determined and controlled by control units 500a and 500b as shown in FIG. 7A and FIG. 7B.

FIG. 7A illustrates the control unit 500a configured to control cleaning conditions and timing of the first nozzle 233a by monitoring film-forming conditions when DCS is supplied. That is, each time a film-forming process is performed, the supply amount of DCS is monitored by a monitoring unit 510a which is configured to monitor the first MFC 241a which is a flowrate controller (flowrate control unit) or to monitor a process recipe (film-forming process conditions), and the monitored supply amount of DCS is added by a counter such as an adding unit 520a. The added DCS supply amount (the accumulated amount of DCS) is stored in a memory device such as a memory unit 530a. The accumulated amount of DCS is compared with a predetermined threshold value by a comparison unit 540a. The threshold value is preset at the comparison unit 540a.

If the accumulated amount of DCS reaches the threshold value, the comparison unit 540a informs a signal output unit 550a of the event, and then the signal output unit 550a sends at least one of a cleaning condition setting signal and a cleaning start signal to the controller 280.

Similarly, FIG. 7B illustrates the control unit 500b configured to control cleaning conditions and timing of the second nozzle 233b by monitoring film-forming conditions when $NH_3$ is supplied through the second nozzle 233b. That is, each time a film-forming process is performed, the supply amount of $NH_3$ is monitored by a monitoring unit 510b which is configured to monitor the second MFC 241b which is a flowrate controller (flowrate control unit) or to monitor a process recipe (film-forming process conditions), and the monitored supply amount of $NH_3$ is added by a counter such as an adding unit 520b. The added $NH_3$ supply amount (the accumulated amount of $NH_3$) is stored in a memory device such as a memory unit 530b. The accumulated amount of $NH_3$ is compared with a predetermined threshold value by a comparison unit 540b. The threshold value is preset at the comparison unit 540b.

If the accumulated amount of $NH_3$ reaches the threshold value, the comparison unit 540b informs a signal output unit 550b of the event, and then the signal output unit 550b sends at least one of a cleaning condition setting signal and a cleaning start signal to the controller 280.

In addition, after considering things related to cleaning quality, such as whether a desired film is uniformly removed (without over-etching of quartz), whether corrosion occurs, whether contaminants generate, and whether remaining gas affects a film-forming process, cleaning conditions are timing are determined to increase the etching rate (that is, throughput).

Furthermore, when the inside of the process tube 203 is cleaned, inert gas is continuously supplied to the first nozzle 233a and the second nozzle 233b.

Furthermore, cleaning of the inside of the process tube 203 may be overlapped with cleaning of the inner wall of the first nozzle 233a at least partially. In this case, if the cleaning of the inner wall of the first nozzle 233a is performed at the same pressure as a pressure at which the cleaning of the inside of the process tube 203 is performed, the first nozzle 233a may be damaged and broken. On other hand, if the cleaning of the inside of the process tube 203 is performed at the same pressure as a pressure at which the cleaning of the inner wall of the first nozzle 233a is performed, the cleaning time may be increased because the pressure is too low. For this reason, although the cleaning of the inner wall of the first nozzle 233a is performed at the same pressure as a pressure at which the cleaning of the inside of the process tube 203 is performed, a low-concentration cleaning gas is supplied to the inner wall of the first nozzle 233a. Since a cleaning gas is supplied only through the short pipe 301 during a cleaning process of the inside of the process tube 203 and a cleaning gas is supplied only to the first nozzle 233a during a cleaning process of the inner wall of the first nozzle 233a, flowrate tuning is necessary for performing the two cleaning processes at the same time.

In addition, if the amount of silicon attached to the inner wall of the first nozzle 233a is large, since it is difficult to remove the silicon from the first nozzle 233a, the pressure of a cleaning process is increased. However, if the pressure is increased too much, although the cleaning process can be completed more rapidly owing to an increased etching rate, the first nozzle 233a may be devitrified due to generation of heat. If the first nozzle 233a is damaged in this way, it may be necessary to replace the first nozzle 233a. In addition, since the inside of the first nozzle 233a is narrow and long, by rapidly making the inside pressure of the first nozzle 233a uniform, the rate of etching can be made uniform in the vertical direction.

According to the current embodiment, one or more of the following effects can be attained.

The inside of the process tube 203, where a silicon nitride is accumulated, and the inner wall of the first nozzle 233a, where a silicon source such as DCS is supplied and a silicon film is accumulated, are cleaned under conditions optimized for the respective parts, so that cleaning can be efficiently performed with less contamination, damage of the process tube 203, and damage of the first nozzle 233a.

That is, cleaning can be thoroughly performed with less cleaning time and good gas consumption efficiency without a remaining film.

In addition, generation of contamination caused by excessive etching conditions can reduced; operational costs can be reduced because the process tube 203 and the first nozzle 233a can be less damaged; and maintenance time can be reduced.

When a silicon nitride film attached to the inside of the process tube 203 is cleaned, by filling a high-concentration cleaning gas in the entire inside of the process tube 203 and increasing the inside pressure of the process tube 203, particularly, the upper part of the process chamber 201 can be less affected by gas flow distribution, and the cleaning process can be completed within a shorter time.

When a silicon nitride film attached to the inside of the process tube 203 is cleaned, by alternately repeating supply of a cleaning gas and exhaustion of the cleaning gas (cyclic supply), stagnant gas can be exhausted by distribution of gas flows and thus be replaced with a cleaning gas. That is, exhaustion of gas that has reacted with a silicon nitride film accumulated on the inside of the process tube 203 (that is, exhaustion of gas that does not contribute to cleaning anymore), and introduction of a new cleaning gas are repeated, so that cleaning can be effectively performed with a shorter time and less consumption of cleaning gas.

When cleaning a silicon film attached to the inner wall of the first nozzle 233a which is used to supply a silicon source such as DCS, pressure is kept lower than a pressure at which the inside of the process tube 203 is cleaned, so as to weaken cleaning reaction power for preventing damage of a quartz part. In addition, if reaction power is high, heat generation may increase to cause breakage of a quartz part, and if reaction speed is high, a silicon film may decompose destructively to cause contamination. That is, these disadvantages can be prevented.

When cleaning a silicon film attached to the inner wall of the first nozzle 233a which is used to supply a silicon source such as DCS, supply and exhaustion of a cleaning gas are continuously performed instead of alternately repeating them, so that gas participated in reaction and not participated in reaction can be efficiently discharged and the cleaning process can be rapidly completed.

(4) Another Embodiment

Figure 6:
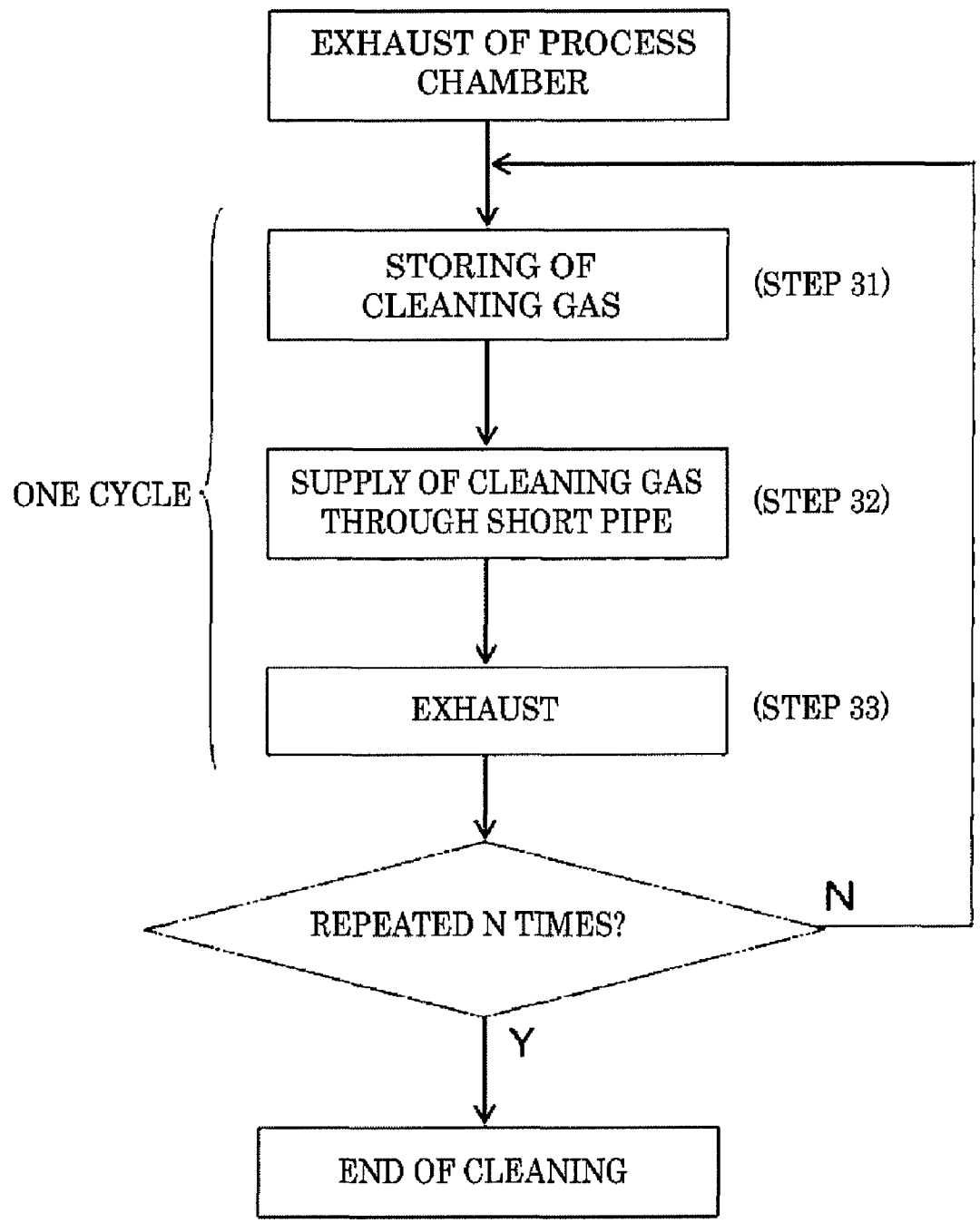
FIG. 6 is a flowchart for explaining a cleaning method according to another embodiment of the present invention.
Figure 8:
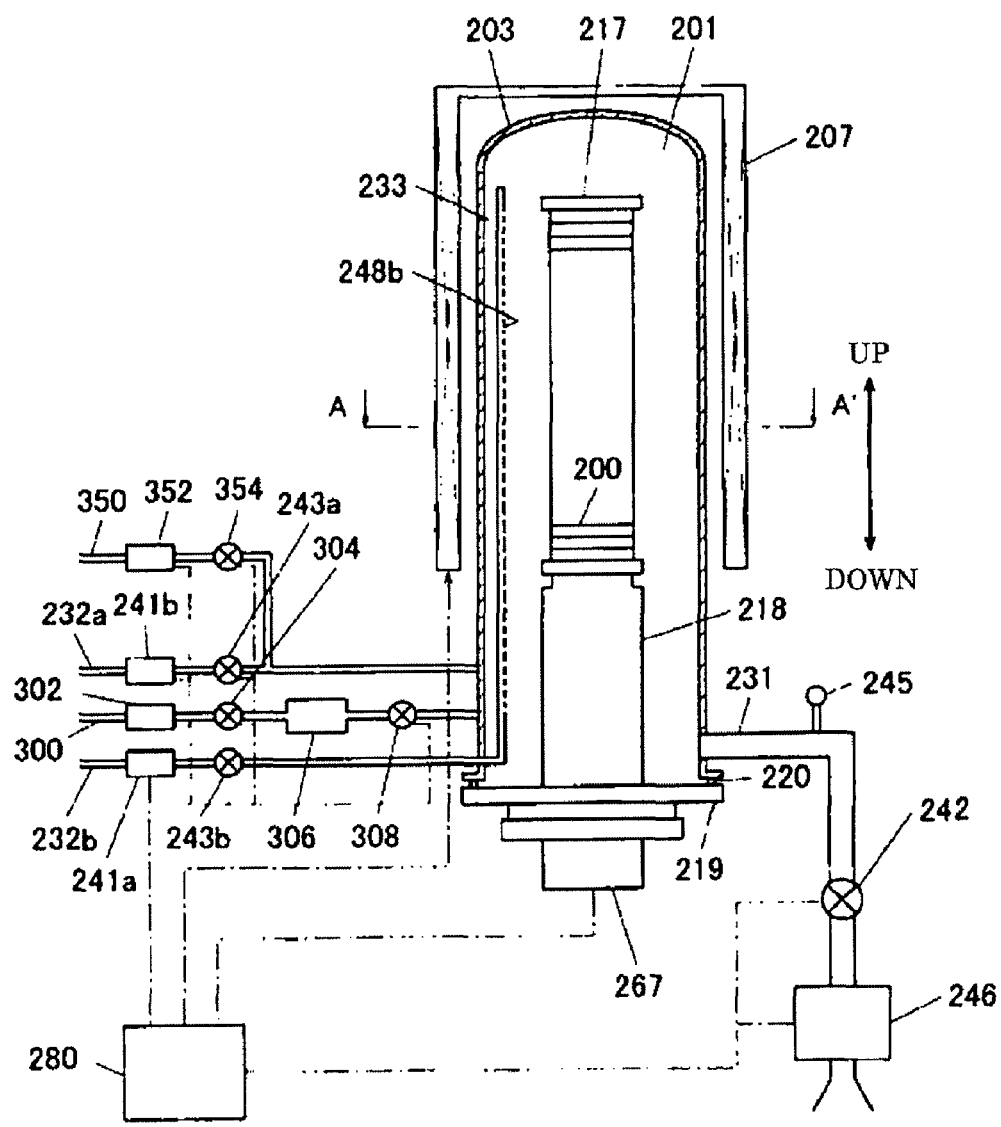
FIG. 8 is a schematic view illustrating a vertical process furnace of a substrate processing apparatus suitable for another embodiment of the present invention.

According to another embodiment, a method of cleaning the process tube 203 will now be described with reference to FIG. 6 and FIG. 8. The same elements as those shown in FIG. 1 will be denoted by the same reference numerals, and descriptions thereof will not be repeated.

At a first cleaning gas supply pipe 300, a gas reservoir 306 and an on-off valve such as a fifth valve 308 are installed as well as a flowrate control device such as a third MFC 302 and an on-off valve such as a third valve 304, and the fifth valve 308 is configured to be controlled by a controller 280.

(Step 31)

First, $ClF_3$ gas is filled in a process chamber 201 as follows: in a state where the inside of the process chamber 201 is exhausted by opening an APC valve 242 (a fourth valve 354 is closed), the third valve 304 is opened and the fifth valve 308 is closed so as to introduce $ClF_3$ gas into the first cleaning gas supply pipe 300 and store the $ClF_3$ gas in the gas reservoir 306 while controlling the flowrate of the $ClF_3$ using the third MFC 302 (Step 31).

(Step 32)

If a predetermined amount of $ClF_3$ gas is stored in the gas reservoir 306, the third valve 304 is closed to stop an inflow of $ClF_3$ gas into the gas reservoir 306. In this state, the $ClF_3$ gas stored in the gas reservoir 306 is supplied to the process chamber 201 at a time (a flash flow) by opening the fifth valve 308 so as to fill the inside of the process chamber 201 with the $ClF_3$ gas. In addition, the APC valve 242 is opened to control the inside pressure of the process chamber 201 to a predetermined level (Step 32).

(Step 33)

Like the case where the gas reservoir 306 is not used, gas filled in the process chamber 201 is exhausted (Step 33). After a predetermined time from the opening of the APC valve 242, the process of Step 33 is completed.

After that, Step 31, Step 32, and Step 33 are set as one cycle, and this cycle is repeated predetermined times. In this way, cleaning of the inside of the process tube 203 is completed.

While the process of Step 32 is performed, Step 31 may be concurrently performed to store $ClF_3$ gas in the gas reservoir 306 (that is, the third valve 304 is opened and the fifth valve 308 is closed to store $ClF_3$ gas in the gas reservoir 306). In this case, the process time of the entire cleaning process can be reduced. Furthermore, without Step 31 for storing $ClF_3$ gas in the gas reservoir 306, $ClF_3$ gas may be supplied to the inside of the process chamber 201 and filled in the inside of the process chamber 201 only by manipulating each valve.

As described above, when a silicon nitride film attached to the inside of the process tube 203 is cleaned, a cleaning gas is instantaneously supplied to the inside of the process tube 203 to increase the gas concentration of the inside of the process tube 203 and fill the cleaning gas in the entire inside of the process tube 203. By increasing pressure in this way, particularly, the effect of gas flow distribution in the upper region of the process chamber 201 can be reduced, and cleaning can be performed within a shorter time.

In addition, since the temperature of the lower side of the process tube 203 is lower than temperature of the upper side of the process tube 203, it is more difficult to remove a silicon nitride film attached to the lower side of the process tube 203. Therefore, a cleaning process may be divided into a process of cleaning the entire inside of the process tube 203 and a process of cleaning the lower side of the process tube 203, and the process of cleaning the entire inside of the process tube 203 may be performed at a high pressure (high-pressure cycle) but the process of cleaning the lower side of the process tube 203 may be performed at a relatively low pressure (low-pressure cycle). In the case of the low-pressure process, it is preferable that a cleaning gas be continuously supplied instead of supplying the cleaning gas instantaneously. In this way, the cleaning process of the inside of the process tube 203 may be performed in two cleaning steps: a high-pressure intermittent cleaning step and a low-pressure continuous cleaning step. Alternatively, in a way of varying pressure when a cleaning gas is supplied, silicon nitride films attached to the upper and lower sides of the process tube 203 may be preferentially removed.

In the above described description, a silicon-rich silicon nitride film is described as a film to be formed on a substrate; however, the present invention is not limited thereto. For example, the present invention can be applied to apparatuses configured to form films such as a silicon nitride film having a stoichiometric composition ratio, an aluminum nitride film, a titanium nitride film, a hafnium nitride film, a zirconium nitride film, a silicon oxide film, a silicon oxynitride film, an aluminum oxide film, a titanium oxide film, a hafnium oxide film, a zirconium oxide film, and a silicon oxide film. That is, the present invention can be applied to an apparatus in which different kinds of films are formed on the inside of a process tube and the inner wall of a gas supply nozzle (i.e., an apparatus including gas supply nozzles for respective process gases).

In addition, besides a silicon (Si)-containing gas, a metal element-containing gas such as an aluminum (Al)-containing gas, a titanium (Ti)-containing gas, a hafnium (HO-containing gas, and a zirconium (Zr)-containing gas may be used as a process gas capable of depositing a film by itself at a certain temperature, and besides a nitrogen (N)-containing gas, gas such as an oxygen (O)-containing gas may be used as a process gas incapable of depositing a film by itself at a certain temperature.

Furthermore, although chlorine trifluoride ($ClF_3$) is described as an example of a cleaning gas, the present invention is not limited thereto. For example, gas including at least one gas selected from the group consisting of nitrogen trifluoride ($NF_3$) gas, fluorine ($F_2$) gas, hydrogen fluoride (HF) gas, chlorine ($Cl_2$) gas, and boron trichloride ($BCl_3$) gas may be used as a cleaning gas.

According to the method of manufacturing a semiconductor device, the cleaning method, and the substrate processing apparatus of the present invention, the reaction tube and the gas supply nozzle can be cleaned under conditions optimized according to the film-forming conditions of the reaction tube and the gas supply nozzle, thereby making it possible to perform a cleaning process with less contamination and damages on the reaction tube and the gas supply nozzle.

<Supplementary Note>

The present invention also includes the following preferred embodiments.

(Supplementary Note 1)

According to an embodiment of the present invention, there is provided a method of manufacturing a semiconductor device, the method comprising: loading a substrate into a process chamber; forming a film on the substrate by supplying a first process gas, which comprises at least one of a plurality of elements constituting the film and is capable of depositing a film by itself, to an inside of the process chamber through a first gas introducing part, and supplying a second process gas, which comprises at least one of the others of the plurality of elements constituting the film and is incapable of depositing a film by itself, to the inside of the process chamber through a second gas introducing part; unloading the substrate from the process chamber after the film is formed on the substrate; performing a first cleaning process so as to remove a first deposition substance attached to an inner wall of the first gas introducing part by supplying a cleaning gas to the first gas introducing part; and performing a second cleaning process so as to remove a second deposition substance attached to the inside of the process chamber and having a chemical composition different from that of the first deposition substance by supplying a cleaning gas to the inside of the process chamber through a third gas introducing part connected to a lower side of the process chamber at a position where the substrate is not placed, wherein in the performing of the first cleaning process, cleaning conditions are set according to accumulated supply time of the first process gas supplied to the inside of the process chamber through the first gas introducing part, and in the performing of the second cleaning process, cleaning conditions are set according to an accumulated thickness of the film formed on the substrate.

(Supplementary Note 2)

Preferably, the cleaning conditions may be a pressure of the inside of the process chamber and a flowrate of the cleaning gas.

(Supplementary Note 3)

Preferably, a pressure of the inside of the process chamber in the first cleaning process may be set to be lower than a pressure of the inside of the process chamber in the second cleaning process.

(Supplementary Note 4)

Preferably, the first deposition substance may comprise at least one of the plurality of elements as a main component, and the second deposition substance may comprise the plurality of elements as main components.

(Supplementary Note 5)

Preferably, the first process gas may be a silicon-containing gas, and the second process gas may be a nitrogen-containing gas.

(Supplementary Note 6)

Preferably, the cleaning gas may comprise at least one selected from the group consisting of nitrogen trifluoride ($NF_3$) gas, chlorine trifluoride ($ClF_3$) gas, fluorine ($F_2$) gas, hydrogen fluoride (HF) gas, chlorine ($Cl_2$) gas, and boron trichloride ($BCl_3$) gas.

(Supplementary Note 7)

Preferably, in the first cleaning process, the cleaning gas may be continuously supplied to the first gas introducing part, and in the second cleaning process, the cleaning gas may be intermittently supplied to the inside of the process chamber.

(Supplementary Note 8)

According to another embodiment of the present invention, there is provided a cleaning method for removing a film attached to an inside of a process chamber of a substrate processing apparatus which is used to form a film on a substrate by supplying a process gas to the substrate, the cleaning method comprising: setting pressure of the inside of the process chamber to a first pressure and intermittently supplying a cleaning gas to the inside of the process chamber; and setting the pressure of the inside of the process chamber to a second pressure higher than the first pressure and continuously supplying the cleaning gas to the inside of the process chamber.

(Supplementary Note 9)

According to another embodiment of the present invention, there is provided a method of manufacturing a semiconductor device, the method comprising: loading a substrate into a process chamber; forming a film on the substrate by supplying a first process gas, which comprises at least one of a plurality of elements constituting the film and is capable of depositing a film by itself, to an inside of the process chamber through a first gas introducing part, and supplying a second process gas, which comprises at least one of the others of the plurality of elements constituting the film and is incapable of depositing a film by itself, to the inside of the process chamber through a second gas introducing part; unloading the substrate from the process chamber after the film is formed on the substrate; performing a first cleaning process so as to remove a first deposition substance attached to an inner wall of the first gas introducing part by supplying a cleaning gas to the first gas introducing part; and performing a second cleaning process so as to remove a second deposition substance attached to the inside of the process chamber and having a chemical composition different from that of the first deposition substance by supplying a cleaning gas to the inside of the process chamber through a third gas introducing part connected to a lower side of the process chamber at a position where the substrate is not placed, wherein when at least parts of the first cleaning process and the second cleaning process are simultaneously performed, concentration of the cleaning gas supplied to the first gas introducing part is lower than concentration of the cleaning gas supplied through the third gas introducing part.

(Supplementary Note 10)

According to another embodiment of the present invention, there is provided a method of manufacturing a semiconductor device, the method comprising: loading a substrate into a process chamber; forming a film on the substrate by supplying a first process gas, which comprises at least one of a plurality of elements constituting the film and is capable of depositing a film by itself, to an inside of the process chamber through a first gas introducing part, and supplying a second process gas, which comprises at least one of the others of the plurality of elements constituting the film and is incapable of depositing a film by itself, to the inside of the process chamber through a second gas introducing part; unloading the substrate from the process chamber after the film is formed on the substrate; performing a first cleaning process so as to remove a first deposition substance attached to an inner wall of the first gas introducing part by supplying a cleaning gas to the first gas introducing part; and performing a second cleaning process so as to remove a second deposition substance attached to the inside of the process chamber and having a chemical composition different from that of the first deposition substance by supplying a cleaning gas to the inside of the process chamber through a third gas introducing part connected to a lower side of the process chamber at a position where the substrate is not placed, wherein when at least parts of the first cleaning process and the second cleaning process are simultaneously performed, a flowrate of the cleaning gas supplied to the first gas introducing part is lower than a flowrate of the cleaning gas supplied through the third gas introducing part.

(Supplementary Note 11)

According to another embodiment of the present invention, there is provided a substrate processing apparatus comprising: a process chamber configured to accommodate a substrate; a first gas introducing part configured to supply a first process gas, which comprises at least one of a plurality of elements constituting a film to be formed on the substrate and is capable of depositing a film by itself, and a cleaning gas to an inside of the process chamber; a second gas introducing part configured to supply a second process gas, which comprises at least one of the others of the plurality of elements and is incapable of depositing a film by itself, to the inside of the process chamber; a third gas introducing part connected to a lower side of the process chamber at a position where the substrate is not placed and configured to supply a cleaning gas to the inside of the process chamber; an exhaust part configured to exhaust an inside atmosphere of the process chamber; and a control unit configured to control the first gas introducing part, the second gas introducing part, the third gas introducing part, and the exhaust part, wherein after a film is formed on the substrate by supplying the first and second process gases to the inside of the process chamber, the control unit controls the first gas introducing part, the second gas introducing part, the third gas introducing part, and the exhaust part, so as to remove a first deposition substance attached to an inner wall of the first gas introducing part by setting cleaning conditions according to accumulated supply time of the first process gas supplied to the inside of the process chamber through the first gas introducing part and supplying a cleaning gas to the first gas introducing part, and so as to remove a second deposition substance attached to the inside of the process chamber and having a chemical composition different from that of the first deposition substance by setting cleaning conditions according to an accumulated thickness of the film formed on the substrate and supplying a cleaning gas to the inside of the process chamber through the third gas introducing part.

(Supplementary Note 12)

Preferably, the cleaning conditions may be a pressure of the inside of the process chamber and a flowrate of the cleaning gas.

(Supplementary Note 13)

Preferably, the control unit may control the first gas introducing part, the third gas introducing part, and the exhaust part, such that a pressure of the inside of the process chamber when the cleaning gas is supplied through the third gas introducing part is lower than a pressure of the inside of the process chamber when the cleaning gas is supplied through the first gas introducing part.

(Supplementary Note 14)

Preferably, the first deposition substance may comprise at least one of the plurality of elements as a main component, and the second deposition substance may comprise the plurality of elements as main components.

(Supplementary Note 15)

According to another embodiment of the present invention, there is provided a substrate processing apparatus comprising: a process chamber configured to accommodate a substrate; a first gas introducing part configured to supply a first process gas, which comprises at least one of a plurality of elements constituting a film to be formed on the substrate and is capable of depositing a film by itself, and a cleaning gas to an inside of the process chamber; a second gas introducing part configured to supply a second process gas, which comprises at least one of the others of the plurality of elements and is incapable of depositing a film by itself, to the inside of the process chamber; a third gas introducing part connected to a lower side of the process chamber at a position where the substrate is not placed and configured to supply a cleaning gas to the inside of the process chamber; an exhaust part configured to exhaust an inside atmosphere of the process chamber; and a control unit configured to control the first gas introducing part, the second gas introducing part, the third gas introducing part, and the exhaust part, wherein after a film is formed on the substrate by supplying the first and second process gases to the inside of the process chamber, the control unit controls the first gas introducing part, the second gas introducing part, the third gas introducing part, and the exhaust part, so as to set pressure of the inside of the process chamber to a first pressure and supply a cleaning gas intermittently to the inside of the process chamber through the third gas introducing part, and so as to set the pressure of the inside of the process chamber to a second pressure lower than the first pressure and supply the cleaning gas continuously to the inside of the process chamber through the third gas introducing part.

(Supplementary Note 16)

According to another embodiment of the present invention, there is provided a cleaning control apparatus for a process chamber or a silicon-containing gas supply system of a silicon nitride film forming apparatus which is used to form a silicon nitride film having a predetermined silicon/nitrogen composition ratio on a substrate by alternately supplying a silicon-containing gas having a predetermined molecular weight and a nitriding source gas having a predetermined molecular weight, the cleaning control apparatus comprising: a cleaning request signal output unit comprising a memory unit configured to store an accumulated supply amount of silicon-containing gas molecules supplied to an inside of the process chamber through the silicon-containing gas supply system, the cleaning request signal output unit being configured to output a cleaning request signal so as to request cleaning of the silicon-containing gas supply system if the accumulated supply amount of the silicon-containing gas molecules stored in the memory unit becomes equal to or greater than a preset accumulated supply amount of silicon-containing gas molecules; and a cleaning request signal output unit comprising a memory unit configured to store an accumulated supply amount of nitriding source gas molecules supplied to the inside of the process chamber through a nitriding source gas supply system, the cleaning request signal output unit being configured to output a cleaning request signal so as to request cleaning of the nitriding source gas supply system if the accumulated supply amount of the nitriding source gas molecules stored in the memory unit becomes equal to or greater than a preset accumulated supply amount of nitriding source gas molecules.

(Supplementary Note 17)

According to another embodiment of the present invention, there is provided a cleaning control apparatus for a process chamber or a gas introducing part of a substrate processing apparatus which is used to form a predetermined film on a substrate placed in the process chamber by supplying a first process gas comprising at least one of a plurality of elements constituting the film and a second process gas comprising at least one of the others of the plurality of elements constituting the film to an inside of the process chamber through different gas introducing parts, respectively, the cleaning control apparatus comprising: a first monitoring unit configured to monitor a supply amount of the first process gas supplied to the inside of the process chamber through a first introducing part;

a first adding unit configured to accumulate the monitored supply amount of the first process gas; a first memory unit configured to store the accumulated supply amount of the first process gas; a first comparison unit configured to compare the accumulated supply amount of the first process gas with a predetermined threshold value; a first signal output unit configured to output a cleaning request signal so as to request cleaning of an inner wall of the first introducing part if the accumulated supply amount of the first process gas is greater than the predetermined threshold valve; a second monitoring unit configured to monitor a supply amount of the second process gas supplied to the inside of the process chamber through a second introducing part; a second adding unit configured to accumulate the monitored supply amount of the second process gas; a second memory unit configured to store the accumulated supply amount of the second process gas; a second comparison unit configured to compare the accumulated supply amount of the second process gas with a predetermined threshold value; and a second signal output unit configured to output a cleaning request signal so as to request cleaning of an inner wall of the second introducing part if the accumulated supply amount of the second process gas is greater than the predetermined threshold valve.

What is claimed is:

1. A method of manufacturing a semiconductor device, comprising:
    loading a substrate into a process chamber;
    forming a film comprising a plurality of elements on the substrate by supplying a first source gas and a second source gas into the process chamber through a first gas introducing part and a second gas introducing part, respectively, the first source gas comprising at least one of the plurality of elements and the second source gas comprising at least one of the plurality of elements other than those of the first source gas;
    unloading the substrate from the process chamber after the film is formed on the substrate;
    performing a first cleaning process so as to remove a first deposition substance attached to an inner wall of the first gas introducing part by supplying a cleaning gas to the first gas introducing part, the first deposition substance comprising the at least one of the plurality of elements of the first source gas as a main component, wherein a cleaning condition is set according to an accumulated supply time of the first source gas supplied into the process chamber through the first gas introducing part; and
    performing a second cleaning process so as to remove a second deposition substance attached to an inside of the process chamber and having a different chemical composition from that of the first deposition substance by supplying the cleaning gas into the process chamber through a third gas introducing part connected to a lower side of the process chamber at a position where the substrate is not placed, the second deposition substance comprising the plurality of elements as main components, wherein the cleaning condition is set according to an accumulated thickness of the film formed on the substrate,
    wherein the first source gas comprises a silicon-containing gas, and the second source gas comprises a nitrogen-containing gas, and
    wherein the cleaning gas comprises:
        at least one of nitrogen trifluoride ($NF_3$) gas, chlorine trifluoride ($ClF_3$) gas, fluorine ($F_2$) gas, hydrogen fluoride (HF) gas, chlorine ($Cl_2$) gas and boron trichloride ($BCl_3$) gas.

2. The method of claim 1, wherein the cleaning condition comprises a pressure of the inside of the process chamber and a flowrate of the cleaning gas.

3. The method of claim 1, wherein a pressure of the inside of the process chamber in the first cleaning process is set to be lower than that of the second cleaning process.

4. The method of claim 1, wherein the cleaning gas is continuously supplied to the first gas introducing part in the first cleaning process, and the cleaning gas is intermittently supplied into the process chamber in the second cleaning process.

5. A method of manufacturing a semiconductor device, comprising:
    loading a substrate into a process chamber;
    forming a film comprising a plurality of elements on the substrate by supplying a first source gas and a second source gas into the process chamber through a first gas introducing part and a second gas introducing part, respectively, the first source gas comprising at least one of the plurality of elements and the second source gas comprising at least one of the plurality of elements other than those of the first source gas;
    unloading the substrate from the process chamber after the film is formed on the substrate;
    performing a first cleaning process so as to remove a first deposition substance attached to an inner wall of the first gas introducing part by supplying a cleaning gas to the first gas introducing part, the first deposition substance comprising the at least one of a plurality of elements of the first source gas as a main component; and
    performing a second cleaning process so as to remove a second deposition substance attached to an inside of the process chamber and having a different chemical composition from that of the first deposition substance by supplying the cleaning gas into the process chamber through a third gas introducing part connected to a lower side of the process chamber at a position where the substrate is not placed,
    wherein a concentration of the cleaning gas supplied to the first gas introducing part is lower than that of the cleaning gas supplied to the third gas introducing part when at least portions of the first cleaning process and the second cleaning process are performed simultaneously,
    wherein the first source gas comprises a silicon-containing gas, and the second source gas comprises a nitrogen-containing gas, and
    wherein the cleaning gas comprises:
        at least one of nitrogen trifluoride ($NF_3$) gas, chlorine trifluoride ($ClF_3$) gas, fluorine ($F_2$) gas, hydrogen fluoride (HF) gas, chlorine ($Cl_2$) gas and boron trichloride ($BCl_3$) gas.

* * * * *